United States Patent [19]

Sasaki et al.

[11] Patent Number: 4,990,948
[45] Date of Patent: Feb. 5, 1991

[54] FLEXIBLE PRINTED CIRCUIT BOARD

[75] Inventors: Takahide Sasaki; Jun Terashima; Haruhiko Yamanouchi, all of Kanagawa, Japan

[73] Assignee: Canon Kabushiki Kaisha, Tokyo, Japan

[21] Appl. No.: 309,859

[22] Filed: Feb. 14, 1989

Related U.S. Application Data

[62] Division of Ser. No. 136,346, Dec. 22, 1987.

[30] Foreign Application Priority Data

Dec. 27, 1986 [JP] Japan .................................. 61-200451
Dec. 27, 1986 [JP] Japan .................................. 61-200452

[51] Int. Cl.$^5$ .............................................. G03B 7/00
[52] U.S. Cl. .................................... 354/485; 361/398
[58] Field of Search ........ 350/321; 354/485, 400–409, 354/195.1, 286; 361/380, 397, 398, 399, 395

[56] References Cited

U.S. PATENT DOCUMENTS

| | | | |
|---|---|---|---|
| 2,647,224 | 7/1953 | Bruck | 361/398 |
| 2,682,018 | 6/1954 | Phillips | 361/398 |
| 2,703,853 | 3/1955 | Chrystie | 361/398 |
| 4,143,932 | 3/1979 | Boutros | 339/17 F |
| 4,227,788 | 10/1980 | Shimizu et al. | 354/485 |
| 4,412,272 | 10/1983 | Wedertz et al. | 361/383 |
| 4,495,546 | 1/1985 | Nakamura et al. | 361/398 |
| 4,510,551 | 4/1985 | Brainard, II | 361/398 |
| 4,716,259 | 12/1987 | Tokura et al. | 174/68.5 |
| 4,717,933 | 1/1988 | Ando et al. | 354/409 |
| 4,728,834 | 3/1988 | Kumar et al. | 310/68 |
| 4,792,879 | 12/1988 | Bauknecht et al. | 361/424 |
| 4,804,331 | 2/1989 | Eguchi et al. | 439/162 |

Primary Examiner—L. T. Hix
Assistant Examiner—David M. Gray
Attorney, Agent, or Firm—Fitzpatrick, Cella, Harper & Scinto

[57] ABSTRACT

A flexible printed circuit board of band shape installed within a tubular or hollow polygonal prismatic casing along the circumferential direction of the casing is composed of at least two flat areas formed in the flexible printed circuit board, and circuit elements mounted on the flat areas.

14 Claims, 5 Drawing Sheets

FLEXIBLE PRINTED CIRCUIT BOARD

This application is a division of application Ser. No. 136,346 filed Dec. 22, 1987.

BACKGROUND OF THE INVENTION

1. Field of the Invention

This invention relates to the structure of a flexible printed circuit board which allows for deformation from the band-like shape to a shape suited to be installed over the inner wall of a tubular or convex-polygonal casing.

2. Description of the Related Art

The flexible printed circuit board is so thin and so conformable to any shape as to be snugly installed in a narrow space. Therefore, it has been used in many electrical instruments.

In general, the flexible printed circuit board has ICs, resistors, condensers, or other rigid electrical parts mounted on the surface thereof, and electrically conductive patterns fabricated therein to connect these electrical parts to one another.

In order to put such a flexible printed circuit board into a tubular or polygonal casing, it must be bent. If, in this case, the bending occurs in regions at which the rigid electrical parts lie, the soldered portions connecting the electrical parts to the patterns will eventually be peeled off. This leads to lower the fidelity of performance of the circuit board.

For this reason, it has been the common practice in the art that when the space in which the flexible printed circuit board is to be installed is of annular form as, for example, in the mounting for the photographic lens of camera, a flexible printed circuit board 10 is formed to a doughnut-like or arcuate shape as shown in FIG. 2(A). Thus, it is made freed from later bending in the regions described above.

However, even if the high density assembling technique was employed, it often happened that the given space on the board was not large enough in size to accommodate all the electrical parts. Another drawback was that the electrical part whose width was wider than the width A of the doughnut-shaped board 10 could not be brought into assembly within the lens mounting.

Note FIG. 2(B) is a cross-sectional view taken along line B—B of FIG. 2(A). In these figures, an outer barrel 1 and an inner tubular member 2 holding the photographic lens are concentrically positioned.

SUMMARY OF THE INVENTION

An object of the present invention is to provide a flexible printed circuit board which has, despite having rigid electrical parts, to be bent in conformity with an annular space it, when installed, occupies between the inner and outer circular or polygonal walls within a casing, thereby giving advantages of effectively utilizing that annular space which would otherwise be the dead one, permitting the electrical parts to be assembled at a high density, enabling the rigid electrical parts, even though of relatively large size, to be installed, while still maintaining high efficiency of usage of the space, and improving the fidelity of electrical performance.

DETAILED DESCRIPTION OF THE PREFERRED EMBODIMENTS

Figure 1A:
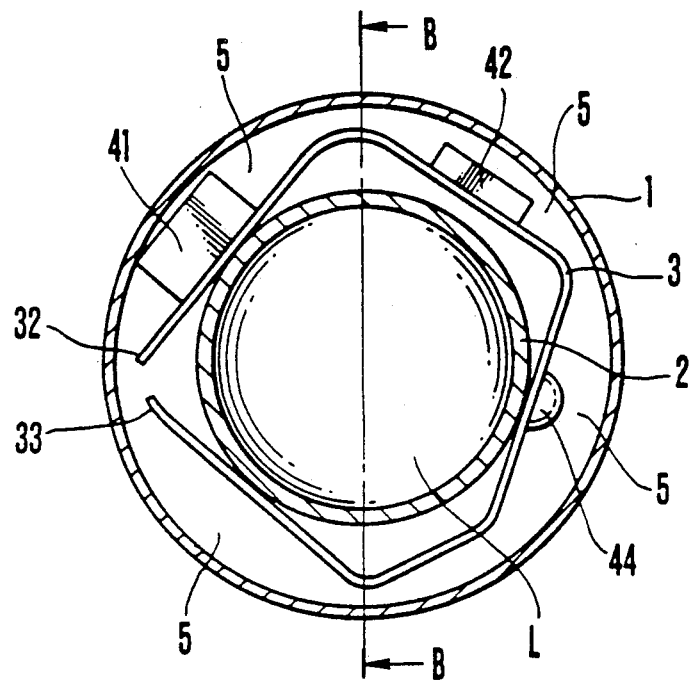
FIGS. 1(A) and 1(B) are respectively cross-sectional and longitudinal section views of a first embodiment of a flexible printed circuit board installed in an annular space within a casing according to the invention.
Figure 1B:
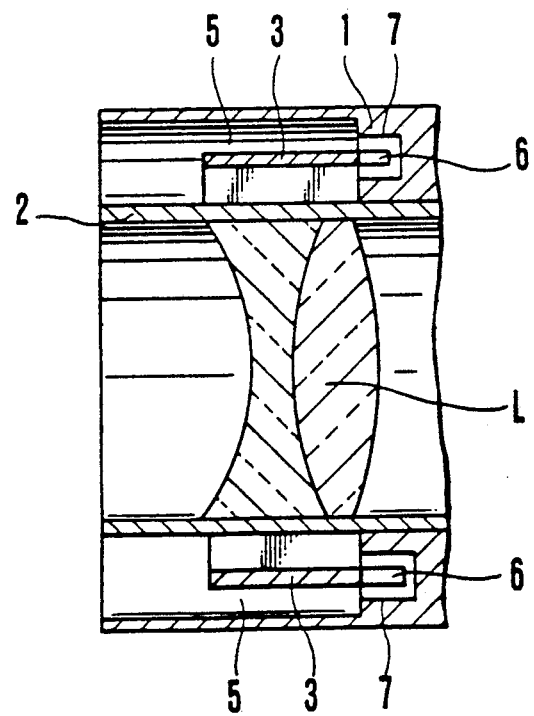
Figure 2A:
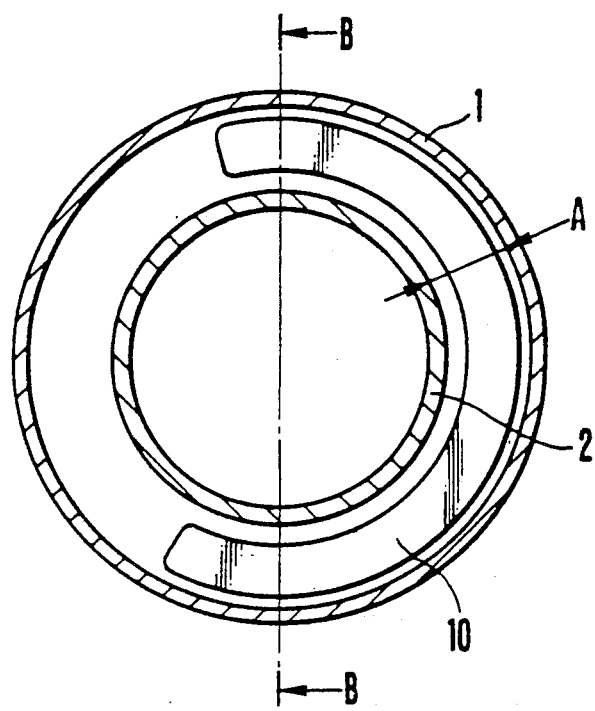
FIGS. 2(A) and 2(B) are similar to FIGS. 1(A) and 1(B) except that the prior art is illustrated.
Figure 2B:
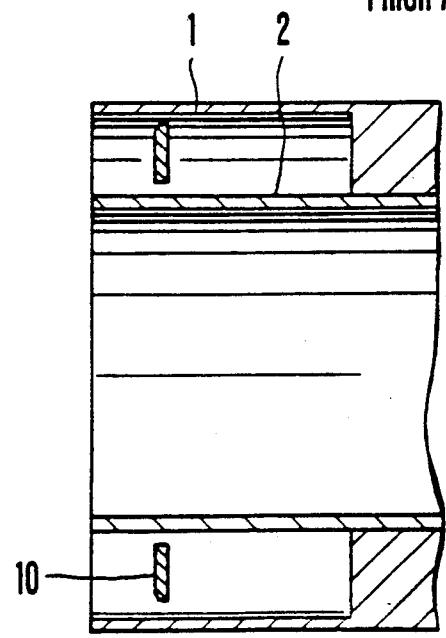

FIG. 1(A) is a schematic view of the first embodiment of the invention applied to the tubular casing, and FIG. 1(B) is a cross-sectional view taken along line B—B of FIG. 1(A).

In these figures, the tubular casing 1 is, for example, the outer barrel of a mounting for the photographic lens of camera. A tubular member 2 holding a lens group L is coaxially positioned in the tubular casing 1 with an annular space 5 therebetween. A band-shaped flexible printed circuit board 3 is made up from a substrate (25 to 50 microns in thickness) of synthetic resin such as polyester or polyimide and patterns of copper foil (17.5 or 35 microns).

Figure 3:
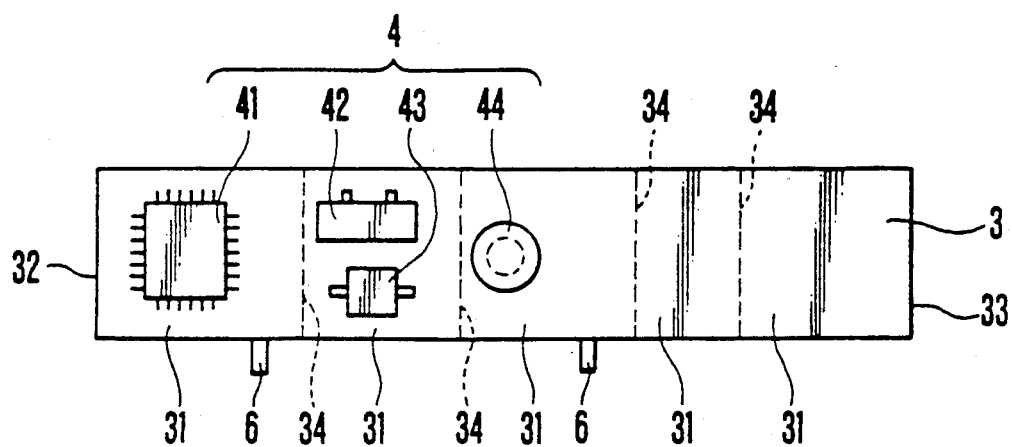
FIG. 3 is a developed view of the flexible printed circuit board of FIG. 1.
Figure 4:
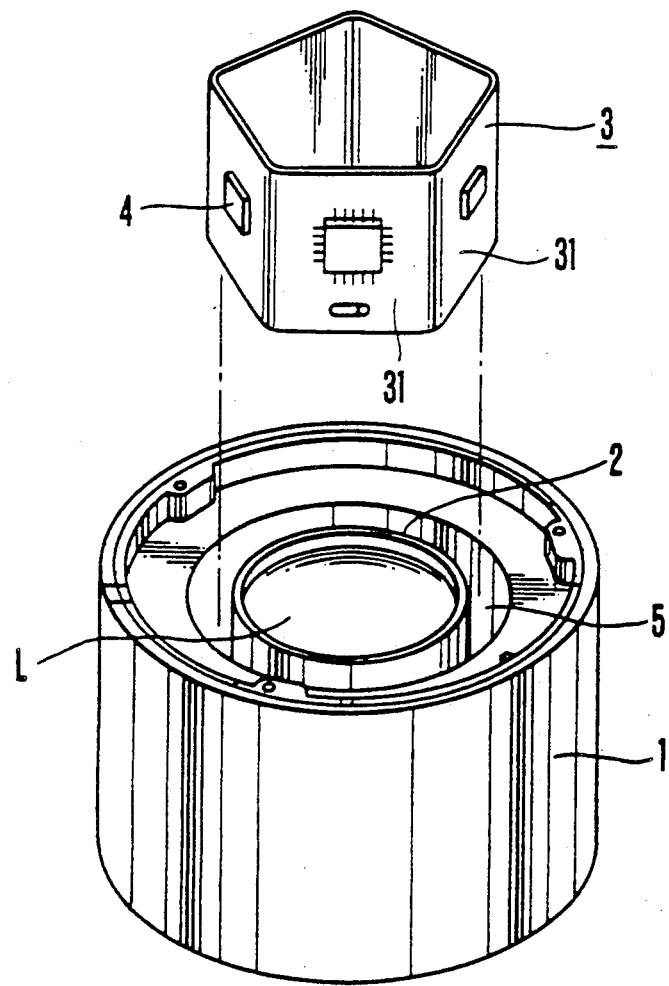
FIG. 4 is a production view of the flexible printed circuit board of FIG. 3 in a form taken about to be put into the casing.

In this embodiment, the flexible printed circuit board 3 in a developed state has such a form as, for example, shown in FIG. 3, or a band-like form. It is then folded at broken line portions 34 so as to form at least two flat areas 31 of either equal or different size to or from each other. The folding region is indicated by a dashed line 34. When it is about to be installed in the casing 1, the flexible printed circuit board 3 takes the form of either a complete polygon as shown in FIG. 4, or a fragment thereof.

Figure 5:
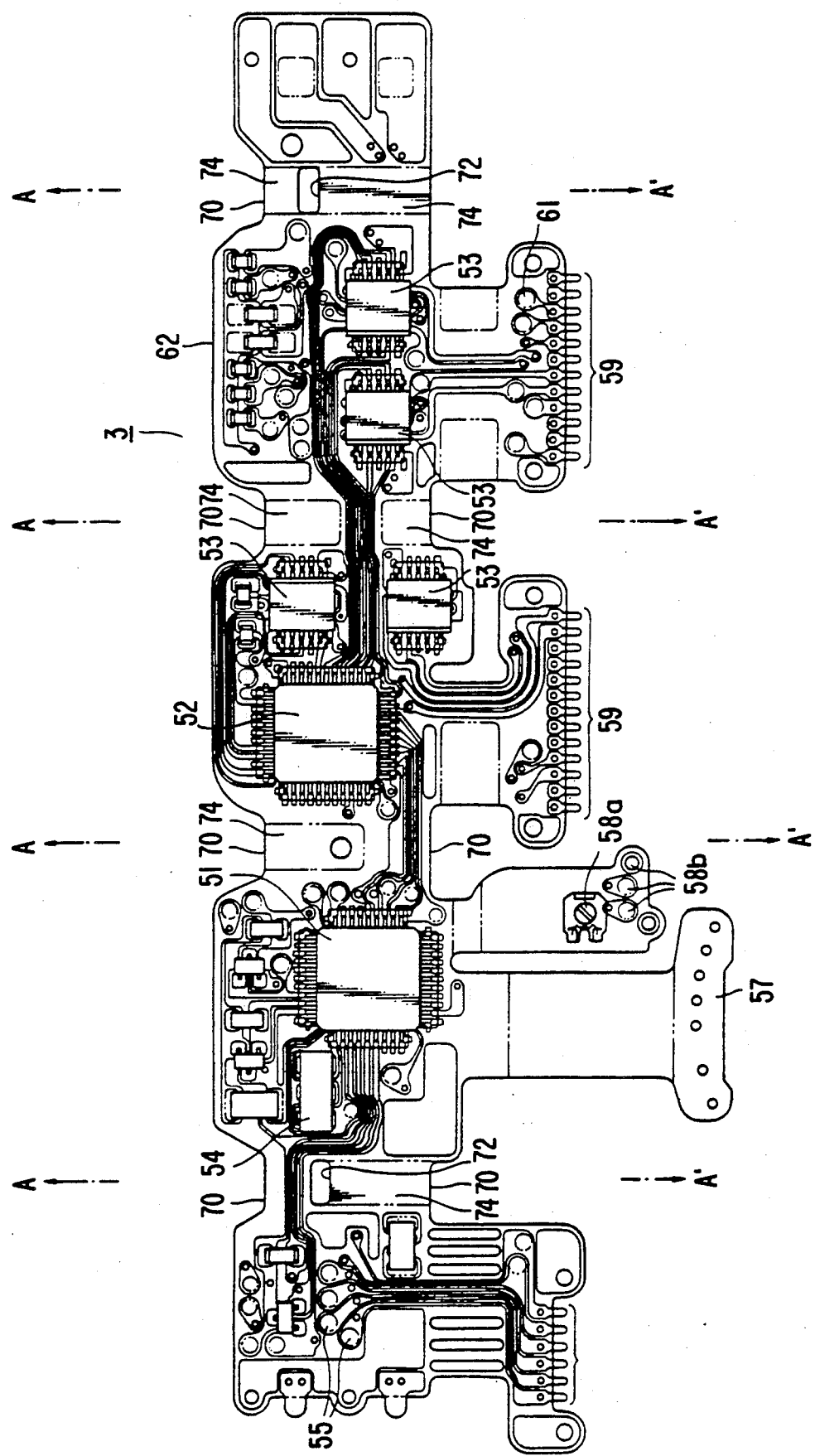
FIG. 5 is a top view of a practical example of the layout of the electrical parts on the flexible printed circuit board of the first embodiment of the invention.

In this embodiment, to facilitate easiness of the operation of folding the board at the prescribed regions, the board 3 is provided, as shown in FIG. 5, with notched portions 70, openings 72, or stripped-off portions of the cover layer (non-cover layer regions 74).

Returning to FIG. 3, the rigid electrical parts generally indicated at 4 include, for example, an IC 41, a resistor 42 and condensers 43 and 44. All these parts 4 are disposed in those areas 31 of the board 3 which are maintained flat when it is folded at such locations as to be snugly fitted in the annular space 5 defined by the tubular casing 1 and the flat areas 31.

FIG. 5 shows an example of configuration of the flat parts in the band of the printed circuit board 3 according to the first embodiment of the invention as adapted to the layout of the elements of an electrical circuit, in particular, for controlling the various operation of the camera, to be installed within the above-described casing 1.

In FIG. 5, the circuit includes an central processing unit (CPU) in the form of a flat package element, an IC also in the form of a flat package element, four TR arrays 53, an oscillator 54, through-holes 55, a set of terminals 56 for giving and receiving zoom signals and others, a set of contacts 57 on the lens mount, a semi-fixed resistor 58a, check pads 58b for use in an assembling line, another set of terminals 59 for connection to a motorized auto-focus device a third set of terminals 60 for connection to an electrically operated diaphragm and other means such as mode selector, another check pad 61, and a miscellaneous collection of electrical parts in an area 62. Note the line A—A' represents a central line about which the adjacent two of the flat areas 31 are folded.

In such a manner, in this embodiment, the band-shaped flexible printed circuit board 3 is folded so as to form the flat areas 31 corresponding to the size of the electrical parts 4. And, the flat areas 31 are arranged to face off the inner surface of the casing 1 at the space 5 that can accommodate the electrical parts 4 of the prescribed size. Thereby, the soldered lead wires of the electrical parts 4 are prevented from getting away from the copper foil patterns of the board 3 when the folding is carried out. This makes it possible to install the complete flexible printed circuit board 3 in the narrow annular space within the casing while still preserving high level of fidelity of electrical performance.

Referring to FIGS. 1(B) and 3, the flexible printed circuit board 3 is provided with two projections 6 extending from the rear long side edge thereof into a common circular groove 7 formed in the front shoulder of an inward flanged portion of the casing 1, thereby the flatness of the flat areas 31 are well stabilized, and their upper spaces 5 are maintained constant in volume. Note the number of this projection 6 may be increased to three or more.

FIG. 4 schematically shows an example of the folded form of the band-shaped flexible printed circuit board 3 when it is about to be put into the space 5 within the casing 1. In this instance the folded form is made to be pentagonal with its inscribed circle in coincidence with the outer surface of the inner tubular member 2.

In this embodiment, the diameter of the inscribed circle of the pentagonal printed circuit board 3 in isolation is slightly smaller than the outer diameter of the inner tubular member 2. After the pentagonal board 3, while being expanded, has been inserted int o the casing 1, therefore, it is clamped on the inner tubular member 2 by its own resilient returning force. Due to no need of using holding means for the board 3, a simplification of the structure is achieved.

The term "band-shaped" herein used means that the flexible printed circuit board 3 when installed can retain itself steadily as the annular space has a shorter axial length than its entire circumferential length. So, even other shapes somewhat different from the band may be used as a matter of course.

According to the first embodiment, a flexible printed circuit board can be realized that, despite having large rigid electrical parts mounted thereon, it can be installed along the wall of a circular or polygonal casing with advantages of using the space with a high efficiency and increasing the density of the electrical parts, while still maintaining the fidelity at a high level.

Next, a second embodiment of the invention is described.

Figure 6A:
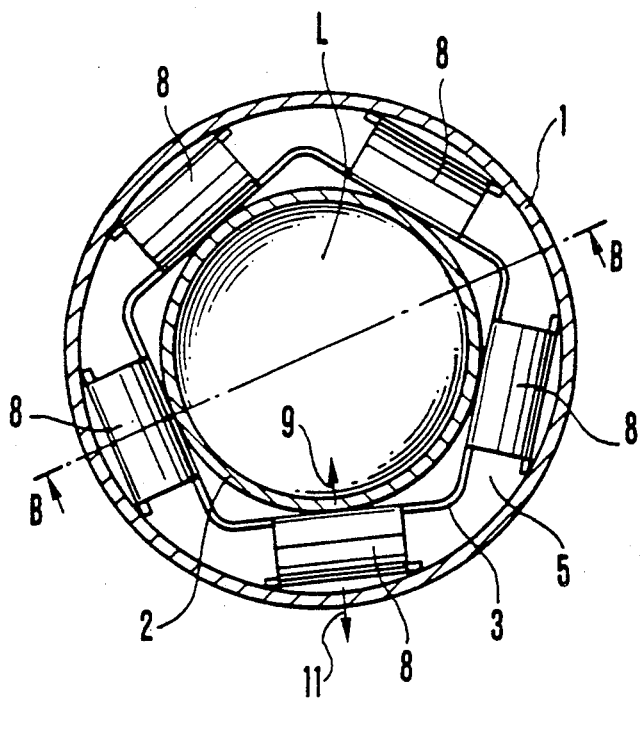
FIG. 6(A) is a front elevational view of a second embodiment of the flexible printed circuit board installed in the annular space within the casing.
Figure 6B:
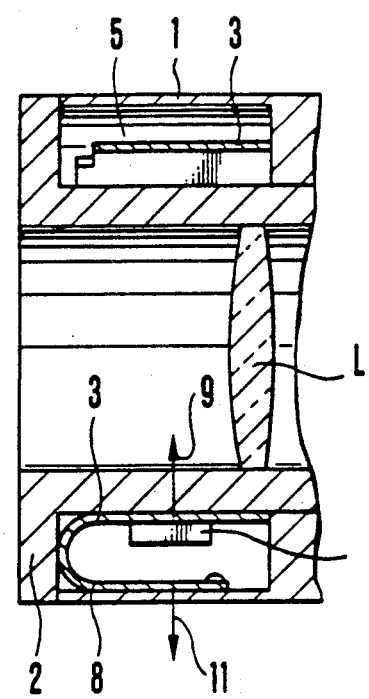
FIG. 6(B) is a cross-sectional view taken along line B—B of FIG. 6(A).
Figure 7:
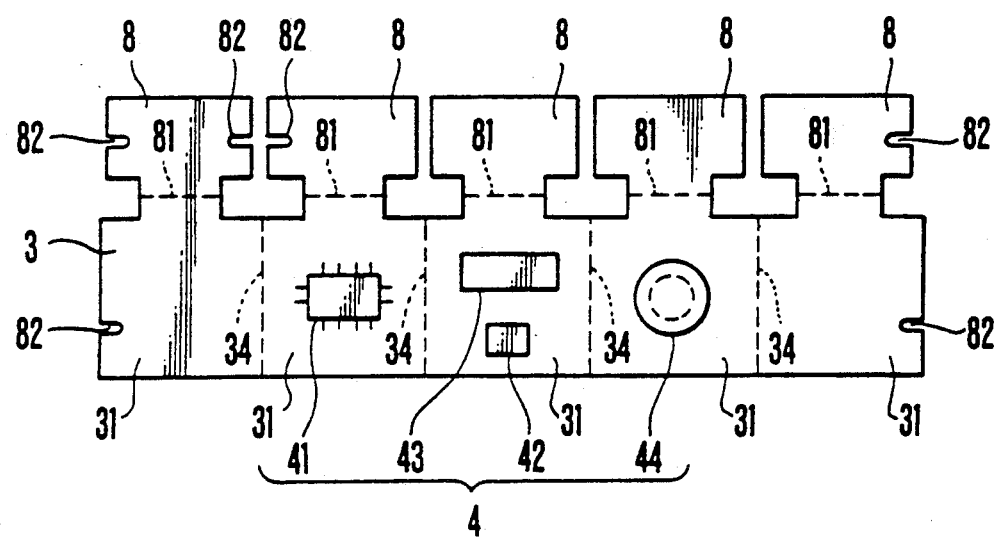
FIG. 7 is a developed view of the flexible printed circuit board of FIG. 6.

FIG. 6(A) schematically shows how to hold a flexible printed circuit board when installed within a tubular casing in the second embodiment FIG. 6(B) is a longitudinal section view taken along line B—B of FIG. 6(A). FIG. 7 is an developed view of the flexible printed circuit board of FIG. 6.

Note the similar parts to those of the first embodiment are denoted by the same reference numerals and are not more described in further detail here.

A land-like projection 8 extends from each of the flat areas 31 of the flexible printed circuit board 3 at the front long side thereof, and is made of the same material as that of the substrate.

The projections 8 each are bent nearly 180° to a letter "U" shape with its center at a broken line portion 81.

In this embodiment, the band-shaped flexible printed circuit board 3 is bent first with the projections 8 at the broken line portion 81 upward to the letter "U" shape, and then folded at the broken line portion 34 to a pentagonal form to install the printed circuit board 3 into the casing 1.

And, in this case, the bent projections 8 each abut on the inner wall of the casing 1 so that its resilient returning force is exerted inward and outward as indicated by arrows 9 and 11 respectively in FIG. 6(A) to fixedly secure the flexible printed circuit board 3 in the annular space defined by the casing 1 and the tubular member 2.

Particularly, in this embodiment, the projection 8 is bent to a large curvature of the letter "U" shape so that a large elastic returning force is exerted. By this, the flexible printed circuit board 3 is steadily fixed on the inner wall of the casing 1.

Note the projection 8 may be bent either outward or inward. Also, another projection may be used at the opposite side of the flat area 31 to that having the projection 8.

In this embodiment, the projection 8 is not necessarily provided for every flat are 31 of the flexible printed circuit board 3, except for at least two.

In this embodiment, to facilitate insertion of the polygonal board 3 into the casing 1, the projections 8 are bent to a stronqer curvature in the letter "U" shape than when it is installed, and the polygonal form is prevented from expanding. For these purposes, each of the projections 8 is provided with a pair of recesses 82 for a temporary erection fastener. A circuit pattern may be present or absent on the projection 8. If absent, a dummy pattern may be formed to reinforce the strength of the substrate.

According to the second embodiment, in addition to the features of the first embodiment the flexible printed circuit board is provided with a number of projections which, in an expanded state, lie in a common plane of the main body thereof. By utilizing the elastic returning force exerted when the projection is bent, it is made possible to install the flexible printed circuit board along the inner wall of the tubular or polygonal casing in fixedly secured relation with good stability without the necessity of using any fastener. Thus, the second embodiment is to provide a flexible printed circuit board of simpler structure.

What is claimed is:

1. An optical apparatus having an area arranged for the passage of light therethrough, comprising:
    a member of substantially tubular shape having a larger diameter than that of said area, both of which are provided in said optical apparatus;

a flexible printed circuit board having a band-like shape and being disposed along a circumferential direction around an optical axis of said optical apparatus between said area and said member, and including:

at least one flat portion formed by folding said flexible printed circuit board along a line in a substantially axial direction with respect to the optical axis; and a plurality of chip-like circuit elements mounted on said flexible printed circuit board, at least one of said elements being mounted on said flat portion, wherein said flat portion has a width in the circumferential direction larger than a width of said at least one of said chip-like circuit elements, and part of said flat portion being located on both sides of said element in the circumferential direction; and wherein said plurality of chip-like circuit elements are disposed in a region of a substantially tubular shape between said area and said member.

2. An optical apparatus according to claim 1, wherein said optical apparatus comprises a photographic lens of a camera.

3. An optical apparatus according to claim 2, further comprising a tubular member adapted for holding a lens group disposed at said area.

4. An optical apparatus according to claim 1, wherein said plurality of chip-like circuit elements include a flat package element having at least three connection legs.

5. An optical apparatus according to claim 1, wherein said flexible printed circuit board has a cover layer and said line is arranged as to not be covered by said cover layer, thereby rendering some of said line more easily foldable than said flat portion.

6. An optical apparatus according to claim 1, wherein said line has a hole or a notch formed therein, thereby permitting said line to be more easily folded than said flat portion.

7. An optical apparatus according to claim 2, wherein said photographic lens comprises a photographic lens member having a groove therein, wherein said flexible printed circuit board further comprises a plurality projection piece extending in the direction of the optical axis, said plurality of projection pieces being adapted to be inserted into the groove provided in said photographic lens member to secure said flat portion.

8. An optical apparatus having an area arranged for light to pass therethrough, comprising:

member of a substantially tubular shape having a larger diameter than that of said area, both of which are provided in said optical apparatus;

a flexible printed circuit board having a band-like shape portion disposed along a circumferential direction around an optical axis of said optical apparatus and including:

at least one flat portion formed by folding said flexible printed circuit board along a line in a substantially axial direction with respect to the optical axis; and a plurality of chip-like circuit elements mounted on said flexible printed circuit board, at least one of said elements being mounted on said flat portion, wherein said flat portion has a width in the circumferential direction larger than a width of said at least one of said chip-like circuit elements, and part of said flat portion being located on both sides of said element in the circumferential direction; and wherein part of said flexible printed circuit board contacts an inner peripheral surface of said member and generates an elastic returning force biasing said flexible printed circuit in the radial direction so that said part of said flexible printed circuit board is held in place by said member.

9. An optical apparatus having an area arranged for light to pass therethrough, comprising:

a member of substantially tubular shape having a larger diameter than that of said area, both of which are provided in said optical apparatus;

a flexible printed circuit board having a band-like shape portion disposed along a circumferential direction around an optical axis of said optical apparatus, including:

at least one flat portion formed by folding said flexible printed circuit board along a line in a substantially axial direction with respect to the optical axis;

a plurality of chip-like circuit elements mounted on said flexible printed circuit board, at least one of said elements being mounted on said flat portion; and a plurality of projected portions projecting from an edge of said flexible printed circuit board and being bent in a substantially U-shape, wherein said flat portion has a width in the circumferential direction larger than the width of said at least one of said chip-like circuit elements, and part of said flat portion being located on both sides of said element in the circumferential direction; and wherein said plurality of projected portions contact an inner peripheral surface of said member and generate an elastic returning force for biasing said flexible printed circuit board in the radial direction so that said member holds said flexible printed circuit board in place.

10. An optical apparatus according to claim 9, wherein said plurality of projected portions project in the radial direction.

11. An optical apparatus according to claim 9, wherein said flexible printed circuit board comprises a series of flat portions, each provided with one of said projected portions.

12. An optical apparatus according to claim 1, wherein said flexible printed circuit board comprises a series of flat portions.

13. An optical apparatus according to claim 8, wherein said flexible printed circuit board comprises a series of flat portions.

14. An optical apparatus according to claim 9, wherein said flexible printed circuit board comprises a series of flat portions.

* * * * *

UNITED STATES PATENT AND TRADEMARK OFFICE
CERTIFICATE OF CORRECTION

PATENT NO. : 4,990,948

DATED : February 5, 1991

INVENTOR(S) : SASAKI, ET AL.

It is certified that error appears in the above-identified patent and that said Letters Patent is hereby corrected as shown below:

COLUMN 1

Line 49, "Note" should read --Note,--.

COLUMN 3

Line 35, "Note" should read --Note,--.
    Line 48, "int o the" should read --into the--.

COLUMN 4

Line 3,  "embodiment" should read --embodiment.--.
    Line 5,  "an" should read --a--.
    Line 7,  "Note" should read --Note,--.
    Line 9,  "more" should be deleted.
    Line 33, "Note" should read --Note,--.
    Line 42, "stronqer" should read --stronger--.

COLUMN 5

Line 33, "is arranged" should read --is so arranged--.

UNITED STATES PATENT AND TRADEMARK OFFICE
CERTIFICATE OF CORRECTION

PATENT NO. : 4,990,948

DATED : February 5, 1991

INVENTOR(S) : SASAKI, ET AL.

It is certified that error appears in the above-identified patent and that said Letters Patent is hereby corrected as shown below:

COLUMN 5

Line 51, "member of a " should read --a member of --.

Signed and Sealed this

Eighth Day of September, 1992

Attest:

DOUGLAS B. COMER

Attesting Officer

Acting Commissioner of Patents and Trademarks